United States Patent

Sourgen et al.

[19]

[11] Patent Number: 5,892,369
[45] Date of Patent: Apr. 6, 1999

[54] METHOD FOR THE DETECTION OF THE PRESENCE OF PASSIVATION IN AN INTEGRATED CIRCUIT

[75] Inventors: Laurent Sourgen, Aix en Provence; Sylvie Wuidart, Pourriéres, both of France

[73] Assignee: SGS-Thomson Microelectronics S.A., Saint Genis, France

[21] Appl. No.: 735,547

[22] Filed: Oct. 23, 1996

[30] Foreign Application Priority Data

Oct. 26, 1995 [FR] France .................................. 95 12659

[51] Int. Cl.[6] .................................................. G01R 31/28
[52] U.S. Cl. ............................................................ 324/765
[58] Field of Search ..................................... 324/765, 763, 324/158.1, 73.1, 537, 719, 716; 438/14, 17; 257/40, 48

[56] References Cited

U.S. PATENT DOCUMENTS 4,434,361  2/1984  Meinguss et al. ...................... 235/192
4,703,260  10/1987  Beha et al. .............................. 324/752
4,814,849  3/1989  Schrenk ..................................... 357/74

OTHER PUBLICATIONS

French Search Report from French Patent Application No. 95 12659, filed Oct. 26, 1995.

Primary Examiner—Vinh P. Nguyen
Attorney, Agent, or Firm—Wolf, Greenfield & Sacks, P.C.

[57] ABSTRACT

A method for detecting the presence of a passivation layer on an integrated circuit comprises sending out a train of pulses of different widths at one end of a line of metal that winds on the surface of the integrated circuit beneath the protection layer of the integrated circuit. The line of metal and the dielectric layer of the integrated circuit form an RC filter. The number of pulses received at the other end of the line of metal is counted and compared with at least one characteristic reference value of the filter.

37 Claims, 3 Drawing Sheets

METHOD FOR THE DETECTION OF THE PRESENCE OF PASSIVATION IN AN INTEGRATED CIRCUIT

BACKGROUND OF THE INVENTION

1. Field of the Invention

The invention relates to a method for the detection of the presence of a dielectric passivation layer in an integrated circuit, and an integrated circuit having such a detector.

2. Discussion of the Related Art

In an integrated circuit, the active layers of the circuit are usually covered with at least one dielectric layer of protection called a passivation layer. Various methods may be used to make this layer.

The passivation layer has the primary function of preventing pollution from having adverse effects on the electrical characteristics of the integrated circuit. The layer also makes it possible to obtain a final surface that is relatively flat. In addition, the passivation layer protects the integrated circuit against possible attempts at fraud. The passivation layer, by its mere presence alone, prevents the observation, by electronic microscope, of the static internal signals of the integrated circuit. Moreover, this insulating layer (passivation layer) also prevents the use of electronic probe tips to set the state of internal signals.

There is a known way of using a passivation presence detector in order to generate an alarm signal, if necessary. This alarm signal may turn off the circuit or may be sent towards an intelligent element of the integrated circuit. Light detectors (diodes) have thus been used, and the capacitive coupling of interdigitated metal combs has also been used. In normal operation, when an input pulse is applied to one comb, an amplified pulse is obtained at the output of the other comb. This amplification is used as the basis of detection. If the passivation layer over the combs is removed, the amplification effect is smaller, giving an attenuated pulse at the output. The passivation presence detector perceives this change and generates an alarm.

However, the constant improvement of techniques for the removal of passivation layers makes it fairly easy to carry out a partial removal of the passivation layer without triggering any alarm, in spite of these passivation presence detectors. In the case of the interdigitated comb detector, it is also possible to short-circuit the two combs and apply an expected amplified signal at the output, this signal being obtained by simulation.

It has therefore become necessary to provide for a detector that can cover the maximum amount of surface area of the integrated circuit. Although possible, it is not practical to pursue a pure and simple increase in the number of known detection devices, as the electronic circuits necessary for detection (especially the comparators) would then take up an excessively large amount of space on the integrated circuit.

Accordingly, it is an object of the present invention to provide a method for detection of the presence of passivation that enables optimal monitoring of the entire surface of the integrated circuit. Another object of the present invention is to provide an integrated circuit comprising a particularly efficient detector of the presence of passivation. A further object of the present invention is to provide an integrated circuit comprising a detector of the presence of passivation that is difficult to simulate.

SUMMARY OF THE INVENTION

An embodiment of the present invention is directed to a method for the detection of the presence of a passivation layer on an integrated circuit. The method comprises sending out a train of pulses of different widths at one end of a line of metal that winds on the surface of the integrated circuit beneath the protection layer, counting the number of pulses received at the other end of the line of metal, and comparing this number with at least one characteristic reference value of the filter formed by the line of metal and the dielectric layer. A further embodiment of the present invention includes synchronizing the transmission and reception of the train of pulses by a random generator of a binary signal.

A further embodiment of the invention is directed to an integrated circuit comprising a detector of the presence of a passivation layer. The detector comprises a line of metal that winds on the surface of the integrated circuit beneath the passivation layer, a transmitter of a train of pulses of different widths at one end of the line of metal, and a receiver connected to the other end of the line of metal. The receiver is capable of counting the number of pulses received and comparing this number with at least one characteristic reference value of the filter formed by the line of metal and the passivation layer.

BRIEF DESCRIPTION OF THE DRAWINGS

A preferred, non-limiting embodiment of the present invention will be described in detail by way of example with reference to the accompanying drawings, in which.

DETAILED DESCRIPTION

Figure 1:
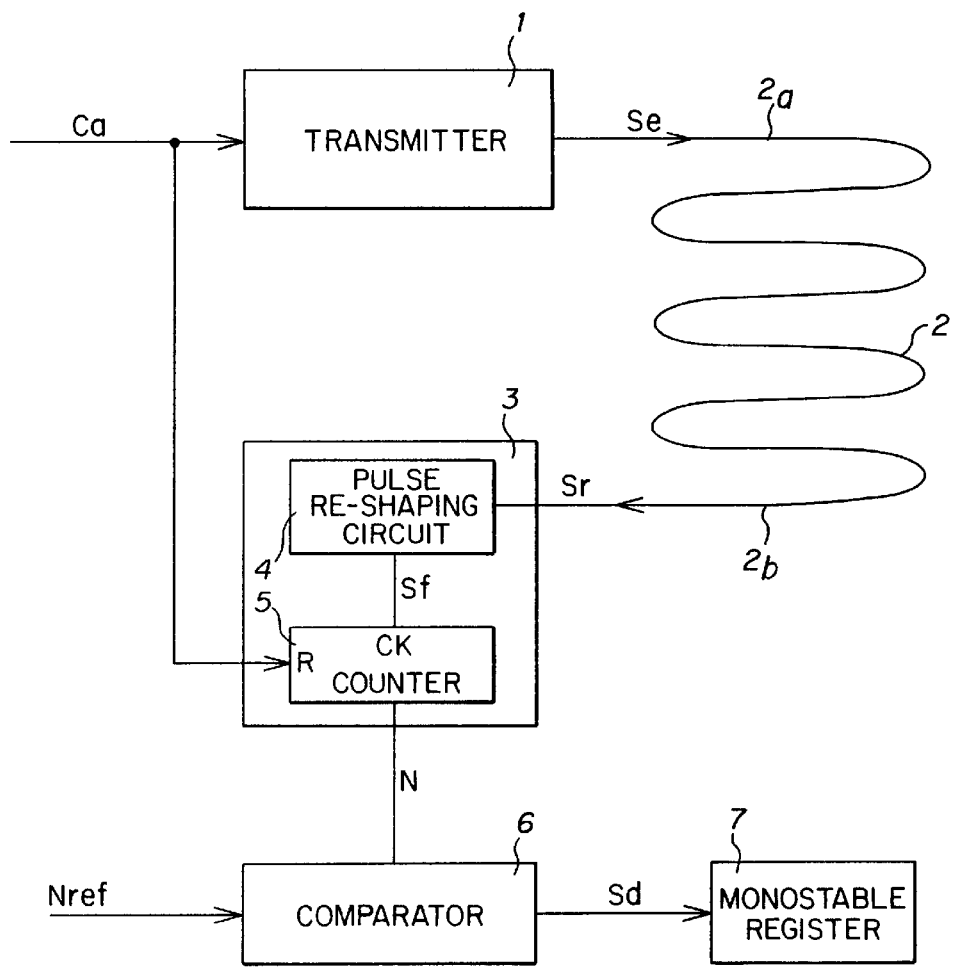
FIG. 1 shows a block diagram of a detection circuit according to an embodiment of the invention.

A detection circuit according to an embodiment of the invention comprises a transmitter 1 that sends a train of pulses of different widths (signal Se) at an end $2_a$ of a line of metal 2. This line of metal 2 takes a winding path on the surface of the integrated circuit beneath a passivation layer. The other end $2_b$ of the line of metal is connected to the input of a receiver 3.

The transmitter typically comprises divider circuits of a reference clock and synchronization circuits to form the train of pulses.

The function of the receiver 3 is to count the number of pulses received at the end 2b. For this purpose, the receiver could include a circuit 4 to reshape the pulses. This circuit may be typically a Schmitt trigger, connected at output to a counter 5. The reshaping circuit receives a signal Sr from the line of metal and delivers a filtered signal Sf to the counter.

Figure 2:
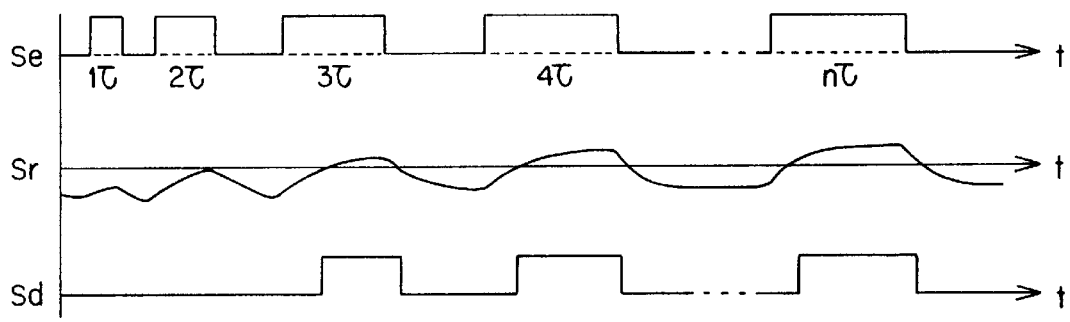
FIG. 2 shows, as a function of time, the signals transmitted and received according to the principle of detection of an embodiment of the invention.

The shapes of the transmitted signal Se, the received signal Sr and the filtered signal Sf are shown in FIG. 2.

The line of metal and the passivation layer form a low-pass RC filter. When a train of pulses of different widths is transmitted at the end $2_a$, the only pulses obtained at the output will be those pulses whose corresponding frequency is greater than the cut-off frequency of this filter. In the example of FIG. 2, all that is used is a train of pulses of increasing width which is a multiple of a reference width τ.

In this example, the received signal Sr shows the attenuated pulses, of which the first pulses having a width τ and 2τ will not be detected by the receiver 3, since their respective frequency is greater than the cut-off frequency of the filter.

The reshaped signal Sf is applied to the clock input CK of the counter which is incremented at each new pulse. It is then sufficient to compare the number counted N with a reference value Nref to deliver a binary signal Sd whose state "0" or "1" indicates whether or not there is an anomaly. This value Nref is computed at the end of manufacture, in a circuit testing routine, wherein the transmitter is made to send out the train of pulses and then the number Nref of pulses received at output is counted. This value Nref is then programmed in the integrated circuit in a non-volatile and non-erasable memory register.

If the number counted N does not correspond to the reference value Nref, it means that the filter RC has been modified, namely that the passivation layer has been removed or damaged and that an alarm should be generated.

In general, the active state of the binary signal Sd that indicates the result of the comparison will be used to trigger a change in the state of a monostable register 7. This register may, for example, be read from time to time by the microprocessor of the integrated circuit in its verification routines or may generate an interrupt to the microprocessor. Only the microprocessor can reset this register. The signal Sd could also be used to activate a self-destruction circuit of an integrated circuit.

To make the comparison, it is possible to use a comparator 6 which receives the counted value N at one input and the reference value Nref at another input.

The comparison may also be made by a microprocessor of the integrated circuit. In this case, it is seen to it that the result of the counter is transferred into a register which is read and then reinitialized by the microprocessor during its checking routines, and that the value N read is compared with the reference value Nref.

To synchronize the different elements, a clock signal Ca is used. Its frequency is a function of the length of the train of pulses to be transmitted. It is applied to the transmitter to make it send the train of pulses again. It is applied to the receiver to transfer the result to the comparator or a register (leading edge), then to reinitialize the counter (trailing edge). It is finally applied, as the case may be, to the comparator to make the comparison.

In view of the variations in the operating parameters, such as the voltage or the temperature which may somewhat modify the response of the filter formed by the line of metal and the passivation layer, the tests made at the end of manufacture are such that they enable a measurement of the impact, on the value Nref, of these different possible variations. It thus becomes possible to define a tolerance interval, demarcated therefore by two reference values Nref1 and Nref2. If the number N counted is between these two values, the result may be considered to be correct. It is therefore advantageously planned to make a comparison with these two values, to prevent untimely alarms due to noise or to variations in operating parameters.

It is furthermore possible to make provision, when the integrated circuit comprises a microprocessor, for carrying out a digital filtering of the results, in order to obtain even greater precision of detection. In this case, the microprocessor will, for example, itself perform the comparison to carry out a smoothing of the results obtained.

The invention described enables resolution of the different problems referred to here above. Indeed, since the line takes a winding path beneath the surface, it becomes very difficult to carry out an even partial withdrawal without the characteristics of the filter being thereby affected. Pulses that normally are excessively short will then be received and counted at the output and the result of the comparison or comparisons will be false. If the line is cut, there will no longer be anything received at output. Finally if, all the same, the foregoing obstacles have been surmounted, it would still be necessary to simulate the train of pulses expected at output.

Figure 3:
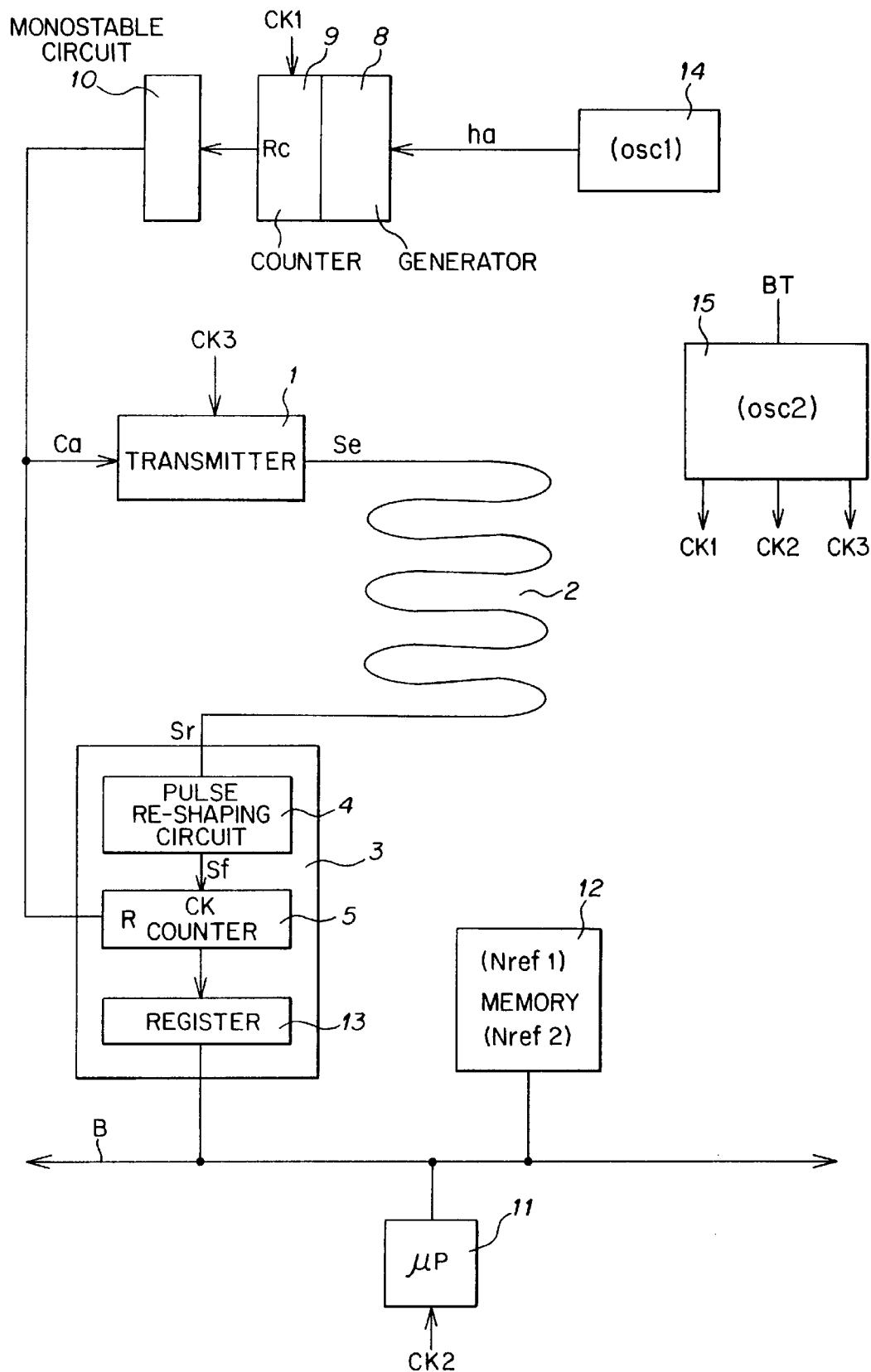
FIG. 3 is a detailed drawing of an integrated circuit including a detection circuit according to an embodiment of the invention.

In a further embodiment, to make the detection highly complex, a pseudo-random generator is provided to generate the synchronization pulse Ca, as shown in FIG. 3. A generator 8 delivers a random value towards a counter 9 which counts down this value to zero, at the rate of a clock CK1. An output Rc (indicating a passage by zero) of the counter then changes its level and this change of state is detected by a monostable circuit 10 that sends out the synchronization pulse Ca. The generator is calibrated so that the synchronization pulse is given at intervals greater than the length of the train of pulses to be sent out.

Preferably, this generator will work with its own clock ha. This clock may itself be made random by being made to vary with noise due to variations in the temperature or the supply voltage of the circuit. The random values generated by the shift registers of the generator may also be reinjected into the generator.

It is also possible, in the integrated circuit, to have (FIG. 3) a microprocessor 11, a non-volatile, non-erasable memory 12 and a register 13 at output of the counter 5 of the receiver 3. This microprocessor, this memory and this register are, in the example, all accessible by a data and address bus B. The other elements of the receiver 3 (reshaping circuit 4 and counter 5), the transmitter 1 and the synchronization pulse generation circuit (8, 9, 10) are for their part inaccessible by this bus. The pulse generation circuit has available a circuit 14 for the generation of its own clock signal from an oscillator osc1. A time base 15 with an another oscillator osc2 enables the generation of the other clock signals needed for the circuit, especially the clock signal CK2 of the microprocessor and the clock signal (or clock signals) CK3 needed by the transmitter 1 to generate the pulse train (signal Se). Of course, various different structures are possible and the one described herein is but one illustrative and non-limiting example.

Figure 4:
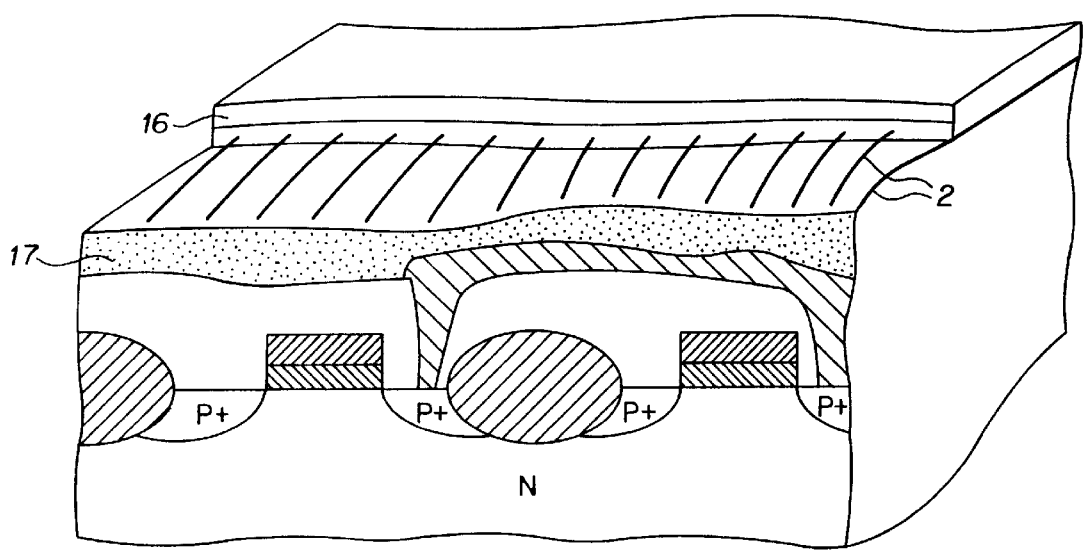
FIG. 4 shows a perspective view of an integrated circuit with a line of metal that winds on the surface according to the principle of an embodiment of the invention.

FIG. 4 shows a perspective view of an integrated circuit with a line of metal 2 that winds on the surface beneath the final passivation layer 16. Beneath the line of metal, there is an insulator 17 and the so-called active layers of the integrated circuit.

Clearly, changes may be made to the circuit as described and illustrated herein without, however, departing from the scope of the present invention.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for detecting a presence of a passivation layer on an integrated circuit, the method comprising the steps of:
    sending a train of pulses having different widths at a first end of a line of metal that winds on a surface of the integrated circuit beneath the passivation layer;

receiving a number of pulses of the train of pulses at a second end of the line of metal;

counting the number of pulses received; and comparing the number of pulses received with at least one characteristic reference value of a filter that is formed by the line of metal and the passivation layer.

2. The method of claim 1, wherein the step of comparing compares the number of pulses received with two characteristic references values of the filter, the two characteristic reference values defining a tolerance interval of the filter.

3. The method of claim 1, wherein the step of sending the train of pulses sends the train of pulses sequentially in response to activation of a binary signal that synchronizes the step of receiving.

4. The method of claim 3, wherein the binary signal is activated randomly.

5. The method of claim 1, wherein the step of comparing is performed by a microprocessor on the integrated circuit, the method further comprising a step of performing, by the microprocessor, a digital filtering of a result of the step of comparing.

6. A detector of a presence of a passivation layer on an integrated circuit, the detector comprising:

a line of metal that winds on a surface of the integrated circuit beneath the passivation layer;

a transmitter of a train of pulses of different widths coupled to a first end of the line of metal; and a receiver coupled to a second end of the line of metal, the receiver being capable of counting a number of pulses received at the second end of the line of metal and comparing the number with at least one characteristic reference value of a filter that is formed by the line of metal and the passivation layer.

7. The detector of claim 6, wherein the number of pulses counted is compared with two characteristic reference values of the filter, the two characteristic values defining a tolerance interval of the filter.

8. The detector of claim 6, further comprising:

a non-volatile memory element, coupled to the receiver, to store the at least one characteristic reference value.

9. The detector of claim 6, further comprising:

a circuit, coupled to the transmitter and the receiver, to sequentially generate a binary signal, the binary signal being applied to the transmitter to send out pulse trains successively and to the receiver to carry out counting and comparing.

10. The detector of claim 9, wherein the circuit to sequentially generate the binary signal includes a random generator.

11. The detector of claim 9, wherein the receiver includes a counter, the detector further comprising:

a microprocessor, coupled to the counter, to read an output of the counter, to compare the output of the counter with the at least one characteristic reference value of the filter, and to perform digital filtering on results of the comparison.

12. A circuit to detect change in a passivation layer of an integrated circuit, the circuit comprising:

a line of metal that winds on a surface of the integrated circuit beneath the passivation layer, the line of metal and the passivation layer forming a filter;

a transmitter, coupled to a first end of the line of metal, to transmit a train of pulses having different pulse widths;

a receiver, coupled to a second end of the line of metal, to receive a number of pulses in the train and count the number of pulses; and a comparator, coupled to the receiver, to compare the number of pulses that are counted with a first reference value of the filter and provide a result that is indicative of change in the passivation layer.

13. The circuit of claim 12, wherein the comparator compares the number of pulses that are counted with a second reference value of the filter to provide the result, the result indicating change in the passivation layer when the number of pulses that are counted is outside the first and second reference values and indicating no change in the passivation layer when the number of pulses that are counted is between the first and second reference values.

14. The circuit of claim 12, wherein the receiver includes:

a first circuit, coupled to the second end of the line of metal, to receive the number of pulses in the train and re-shape each pulse of the number of pulses; and a counter, coupled to the first circuit and the comparator, to count the number of pulses re-shaped by the first circuit.

15. The circuit of claim 14, further comprising:

a synchronization circuit, coupled to the transmitter, to generate a synchronization signal initiating transmission of the train of pulses;

a register, coupled between the counter and the comparator, to store the number of pulses counted by the counter; and a memory, coupled to the comparator, to store the first reference value.

16. The circuit of claim 15, wherein the comparator includes a microprocessor that reads the number of pulses stored in the register and compares the number of pulses to the first reference value to provide the result.

17. The circuit of claim 16, wherein the microprocessor digitally filters the number of pulses stored in the register prior to comparing to account for variations in voltage and temperature of the integrated circuit.

18. The circuit of claim 12, further comprising:

a synchronization circuit, coupled to the transmitter and the receiver, to generate a synchronization signal that initiates transmission of the train of pulses and transfers the number of pulses that are counted from the receiver to the comparator.

19. The circuit of claim 18, wherein the synchronization circuit includes:

a generator to generate a random value;

a counter, coupled to the generator to receive the random value and count from the random value to a second value; and a monostable circuit, coupled to the counter, to provide the synchronization signal when the counter reaches the second value.

20. A method of detecting change in a passivation layer of an integrated circuit, the method comprising the steps of:

sending a series of pulses having different pulse widths at a first end of a line of metal that winds on a surface of the integrated circuit beneath the passivation layer, the line of metal and the passivation layer forming a filter;

receiving a number of pulses in the series at a second end of the line of metal;

counting the number of received pulses; and comparing the number of counted pulses with at least one reference value of the filter to detect change in the passivation layer.

21. The method of claim 20, wherein the change in the passivation layer is detected when the number of counted pulses varies from the at least one reference value.

22. The method of claim 20, wherein the step of comparing compares the number of counted pulses with two reference values of the filter, the change in the passivation layer being detected when the number of counted pulses is outside the two reference values.

23. The method of claim 22, further comprising a step of:

selecting the two reference values for the filter so that under operational ranges of temperature and voltage, the number of counted pulses is between the two reference values when the passivation layer is unchanged.

24. The method of claim 20, wherein the step of sending sends pulses having pulse widths that correspond to frequencies that are larger and smaller than a cut-off frequency of the filter, the method further comprising a step of:

attenuating pulses in the series of pulses having pulse widths that correspond to frequencies lower than the cut-off frequency of the filter so they are not counted.

25. The method of claim 20, further comprising a step of signaling an alarm when the change in the passivation layer is detected.

26. The method of claim 20, further comprising a step of:

synchronizing the steps of sending and receiving based on a signal having a frequency that corresponds to a length of the series of pulses, a first state of the signal initiating the step of sending and a second state of the signal terminating the step of counting and initiating the step of comparing.

27. The method of claim 26, wherein the signal has a frequency that is greater than the length of the series, the method further comprising a step of generating the signal randomly.

28. The method of claim 20, further comprising a step of filtering the number of counted pulses to account for variations in voltage and temperature of the integrated circuit.

29. A circuit to detect change in a passivation layer of an integrated circuit, the circuit comprising:

a transmitter to transmit a plurality of pulses having a plurality of different pulse widths;

a receiver, to receive a number of pulses of the plurality of pulses and count the number of pulses received;

a comparator, coupled to the receiver, to compare the number of pulses counted and compare the number of counted pulses with at least one reference value; and variable attenuation means, coupled to the transmitter and the receiver, to vary the number of pulses received in response to changes in the passivation layer.

30. The circuit of claim 29, wherein the variable attenuation means includes a line of metal that winds on a surface of the integrated circuit, the line of metal having a first end that is connected to the transmitter and a second end that is connected to the receiver, the line of metal and the passivation layer forming a filter that attenuates pulses having a pulse width that is less than a predetermined pulse width.

31. The circuit of claim 30, wherein the number of pulses received is greater than the at least one reference value when portions of the passivation layer are removed.

32. The circuit of claim 30, further comprising a register, coupled to the comparator, to store a value indicative of a detected chance in the passivation layer when the number of counted pulses is not equal to the at least one reference value.

33. The circuit of claim 29, wherein the receiver includes:

a first circuit, coupled to a first end of the variable attenuation means, to receive the number of pulses and re-shape each pulse in the number of pulses; and a counter, coupled to the first circuit and the comparator, to count the number of pulses re-shaped by the first circuit.

34. The circuit of claim 29, further comprising:

a synchronization circuit, coupled to the transmitter and the receiver, to generate a synchronization signal that initiates transmission of the plurality of pulses and transfers the number of pulses that are counted from the receiver to the comparator.

35. The circuit of claim 34, wherein the synchronization circuit includes:

a generator to generate a random value;

a counter, coupled to the generator, to receive the random value and count from the random value to a second value; and a monostable circuit, coupled to the counter, to provide the synchronization signal when the counter reaches the second value.

36. The circuit of claim 29, wherein the comparator includes a microprocessor that filters the number of counted pulses to account for variations in voltage and temperature of the integrated circuit.

37. The circuit of claim 30, wherein the comparator compares the number of pulses counted with two reference values to generate a comparison signal, the comparison signal indicating no change in the passivation layer when the number of pulses is between the two reference values and indicating a change in the passivation layer when the number of pulses is outside the two reference values.

* * * * *